United States Patent [19]

Segawa et al.

[11] Patent Number: 4,910,734
[45] Date of Patent: Mar. 20, 1990

[54] INTERGRATED CIRCUIT HAVING TESTING FUNCTION CIRCUIT AND CONTROL CIRCUIT THEREFOR

[75] Inventors: Hiroshi Segawa; Hideyuki Terane, both of Hyogo, Japan

[73] Assignee: Mitsubishi Denki Kabushiki Kaisha, Tokyo, Japan

[21] Appl. No.: 271,487

[22] Filed: Nov. 15, 1988

[30] Foreign Application Priority Data

Nov. 17, 1987 [JP] Japan .................................. 62-291343

[51] Int. Cl.$^4$ .......................................... G01R 31/28
[52] U.S. Cl. ..................... 371/22.3; 371/15.1
[58] Field of Search ................ 371/25, 15, 22.1, 22.3, 371/22.4, 22.5, 22.6, 25.1, 15.1; 324/73 R, 73 AT

[56] References Cited

U.S. PATENT DOCUMENTS

| | | | |
|---|---|---|---|
| 4,317,200 | 10/1979 | Wakatsuki et al. | 371/25 |
| 4,503,386 | 4/1982 | Das Gupta et al. | 324/73 R |
| 4,513,418 | 4/1985 | Bardell | 371/25 |
| 4,519,078 | 9/1982 | Komonytsky | 371/25 |
| 4,553,236 | 11/1985 | Zasio | 371/15 |
| 4,597,042 | 6/1986 | d'Angeal | 371/25 X |
| 4,680,733 | 10/1984 | Duforestel et al. | 364/900 |
| 4,697,267 | 9/1987 | Wakai | 371/25 |
| 4,698,588 | 10/1985 | Hwang et al. | 324/73 R |
| 4,701,921 | 10/1987 | Powell | 31/25 |
| 4,701,922 | 10/1987 | Kuboki | 371/25 |
| 4,710,931 | 12/1987 | Bellay | 371/25 |
| 4,710,933 | 12/1987 | Powell | 371/25 |
| 4,728,883 | 3/1985 | Green | 324/73 R |
| 4,764,926 | 12/1985 | Knight et al. | 371/25 |
| 4,780,666 | 8/1987 | Sakashita | 324/73 R |

OTHER PUBLICATIONS

C. Mead and L. Conway, "Introduction to VLSI Systems", (1980); 66, 67.
C. Mead and L. Conway, "Introduction to VLSI Systems", (1980): 102, 109.
F. Tsui, "LSI/VSLI Testability Design", Chapter 5, Latch Scanning Arrangements (LSA), (1986): 102, 109.

Primary Examiner—Jerry Smith
Assistant Examiner—Robert W. Beausoliel
Attorney, Agent, or Firm—Lowe, Price, LeBlanc, Becker & Shur

[57] ABSTRACT

A plurality of testing circuits formed of parallel registers are incorporated between a plurality of circuit portions constituting a data processing circuit. Each parallel register comprises scan latch circuits whose number corresponding to the number of sets of input and output terminals of the circuit portion. A first input terminal of each scan latch circuit is connected to an output terminal of the corresponding circuit portion, a second input terminal is connected to an input terminal of the corresponding circuit portion, an output terminal is connected to an input terminal of another circuit portion, respectively, control terminals of the scan latch circuits are connected together in each register to which a control signal is inputted. The testing circuit serves to test the circuit portion or operate the circuit portion upon reception the control signal corresponding to the test mode or the operation mode. The control signal is outputted by a control circuit having two input terminals, and it changes dependent on the combination of signals inputted to the input terminals.

23 Claims, 7 Drawing Sheets

INTERGRATED CIRCUIT HAVING TESTING FUNCTION CIRCUIT AND CONTROL CIRCUIT THEREFOR

CROSS-REFERENCE TO RELATED, COPENDING APPLICATION

A related copending application of particular interest to the present invention is U.S. Ser. No. 07/195,636 entitled "Circuit Device Having a Self-Testing Function and a Testing Method Thereof" filed on May 17, 1988.

A related copending application of particular interest to the present invention 07/271,488 U.S. Ser. No. is 07/271,488 entitled "Circuit Having Testing Function Circuit" filed on Nov. 15, 1988.

BACKGROUND OF THE INVENTION

1. Field of the Invention

The present invention relates to circuits having testing function circuits and, more specifically, to a circuit incorporating a testing circuit for testing each of the circuit portions constituting a data processing circuit.

2. Description of the Prior Art

As the design of circuits such as LSI becomes more and more complicated, the testing thereof also becomes complicated. Sometimes a test circuit is incorporated between circuit portions constituting the circuit so as to enable appropriate testing of each the of circuit portions one by one.

Figure 1:
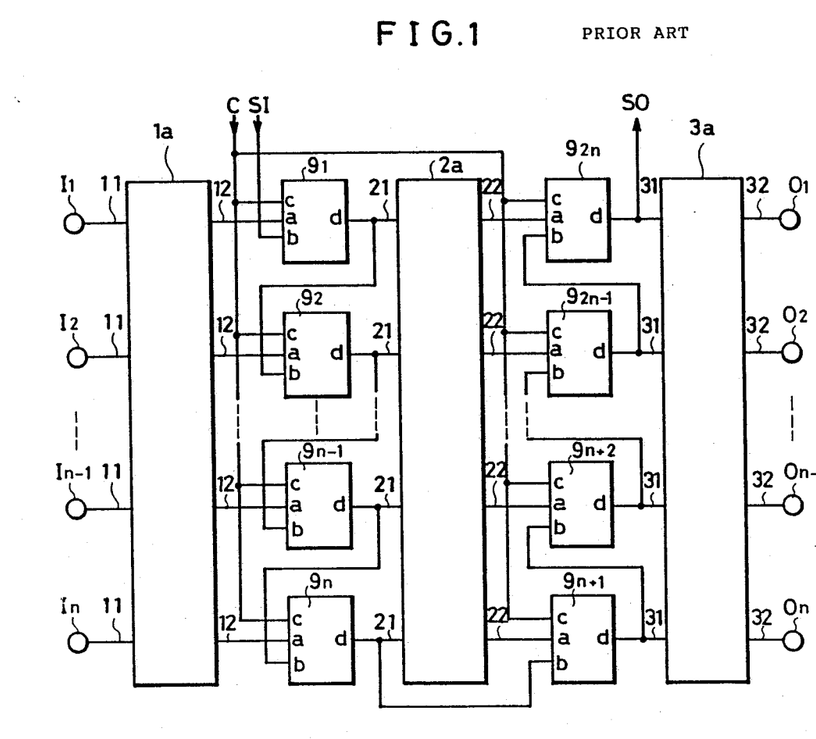
FIG. 1 is a schematic diagram of a conventional circuit having scan resist type testing function.

FIG. 1 is a conventional testing circuit of scan register type incorporated between circuit portions for testing each of the circuit portions.

In testing, the testing circuit inputs test data to a desired circuit portion, and outputs data processed by the exact portion to verify the output data. When it does not test the circuit portion, the whole circuit constituted by a plurality of circuit portions operates normally.

Referring to the figure, the circuit portions $1a$, $2a$, and $3a$ constituting the circuit are, for example, combinational logic circuits having n input terminals 11, 21 and 31 and n output terminals 12, 22 and 32, respectively.

The testing circuit comprises n scan latch circuits $9_1 \sim 9_n$ arranged between the first circuit portion $1a$ and the second circuit portion $2a$, and n scan latch circuits $9_{n+1} \sim 9_{2n}$ arranged between the second circuit portion $2a$ and the third circuit portion $3a$. Each of the scan latch circuits $9_1 \sim 9_{2n}$ has a first input terminal a, a second input terminal b, a control terminal c and an output terminal d. A signal inputted to the first input terminal a or a signal inputted to the second input terminal b is selectively outputted to the output terminal d in correspondence with a control signal C inputted to the control terminal c.

Figure 2:
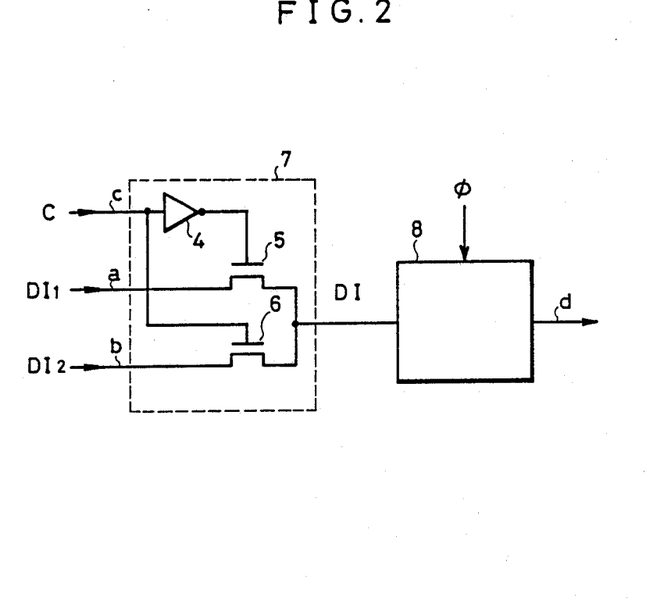
FIG. 2 is a schematic diagram showing a structure of a common scan latch circuit.

FIG. 2 is a schematic diagram showing a structure of a general scan latch circuit, which is applied to the scan latch circuits $9_1 \sim 9_n$ of FIG. 1.

The scan latch circuit is constituted by a multiplexer 7 comprising an inverter 4 and two transmission gates 5 and 6, and a latch circuit 8. In the multiplexer 7, when the control signal C inputted to the control terminal c is at "L" level, the transmission gate 5 is on and the transmission gate 6 is off. Consequently, the signal $DI_2$ inputted to the first input terminal a is transferred to the latch circuit 8. Meanwhile, when the control signal C is at "H" level, the transmission gate 5 is off and the transmission gate 6 is on. Consequently, the signal $DI_2$ inputted to the second input terminal b is transferred to the latch circuit 8.

The latch circuit 8 is a master-slave type latch circuit in synchronization with a clock signal $\phi$ which takes in the data DI from the multiplexer 7 when the clock signal $\phi$ is at the "H" level and outputs and holds the data DI when the clock signal $\phi$ is at the "L" level. Namely, the scan latch circuit takes in the signal $DI_1$ inputted to the first input terminal a when the control signal C is at the "L" level. When the control signal C is at the "H" level, it takes in the signal $DI_2$ inputted to the first input terminal b.

In FIG. 1, the first input terminals a of the scan latch circuits $9_1 \sim 9_n$ of the first to n th stages are respectively connected to the output terminals 12 of the first circuit portion $1a$. The output terminals d are connected to the input terminals 21 of the second circuit portion $2a$ and to the second input terminals b of the scan latch circuits $9_2 \sim 9_{n+1}$ of the succeeding stage, respectively.

The first input terminals a of the scan latch circuits $9_{n+1} \sim 9_{2n}$ of the (n+1)th to 2n th stages are respectively connected to output terminals 22 of the second circuit portion $2a$. The output terminals d are respectively connected to input terminals 31 of third circuit portion $3a$. The output terminals d of the scan latch circuits $9_{n+1} \sim 9_{2n-1}$ of the (n+1)th $\sim$(2n-1)th stages are respectively connected to the second input terminals b of the can latch circuits $9_{n+2} \sim 9_{2n}$ of the succeeding stage, respectively.

The control terminals c of all scan latch circuits $9_1 \sim 9_{2n}$ are connected together to receive the control signal C. The input terminals 11 of the first circuit portion $1a$ are respectively connected to the data input terminals $I_1 \sim I_n$. The output terminals 32 of the circuit portion $3a$ are respectively connected to data output terminals $O_1 \sim O_n$.

In the following the operation of the testing circuit will be described.

The operation of the testing circuit can be divided into the operation mode in which the control signal C is at the "L" level, and the shift mode in which the control signal C is at the "H" level.

In the operation mode, all scan latch circuits $9_1 \sim O_{2n}$ are adapted to take in the signal inputted to first input terminals a. Therefore, the data inputted in parallel from the data input terminals $I_1 \sim I_n$ are inputted to the first circuit portion $1a$, and the data processed in the first circuit portion $1a$ are transferred to the second circuit portion $2a$ through the scan latch circuit $9_1 \sim 9_n$. The data processed in the second circuit portion $2a$ are transferred to the third circuit portion $3a$ through the scan latch circuits $9_{2n} \sim 9_{n+1}$, and the data processed in the circuit portion $3a$ are outputted in parallel from the data output terminals $O_1 \sim O_n$. Namely, in the operation mode, the whole data processing circuit constituted by the circuit portions $1a$, $2a$ and $3a$ carries out normal data processing successively in synchronization with the clock signal $\phi$.

In the shift mode, all scan latch circuits $9_1 \sim 9_{2n}$ are adapted to take in signals inputted to the second input terminals b, so that the scan latch circuits $9_1 \sim 9_{2n}$ constitute one shift register. Therefore, the serial data SI inputted to the second input terminal of the scan latch circuit $9_1$ of the first stage is successively shifted to the scan latch circuits $9_2 \sim 9_{2n}$ of the succeeding stages in synchronization with the clock signal $\phi$ to be outputted from the output terminal d of the scan latch circuit $9_{2n}$ of the last stage as an output data SO. By combining these two operations, the circuit portions can be tested one by one.

In the following, the test of the second circuit portion 2a will be described as an example.

First, the test circuit is set at the shift mode by setting the control signal C at the "H" level. Test data for testing the second circuit portion 2a are serially inputted from the second input terminal b of the scan latch circuit $9_1$ of the first stage to be stored in the scan latch circuits $9_1 \sim 9n$ of the first to n th stages. Thereafter, by setting the control signal C at "L" level, the test circuit is drawn into the operation mode, and the output data of the test data processed by the second circuit portion 2a are taken in to the scan latch circuits $9_{n+1} \sim 9_{2n}$ of the $(n+1)$th$\sim 2n$ th stages. Thereafter, the testing circuit is again switched to the shift mode, and the data held in scan latch circuits $9_{n+1} \sim 9_{2n}$ are serially outputted to the outside from the output terminal d of the scan latch circuit $9_{2n}$ of the last stage by shifting operation to verify the data.

In the above described conventional testing circuit, the test data for testing each circuit portion must be serially inputted, and the data processed in each circuit portion must be serially taken out. Therefore, the test requires long periods of time, and it is difficult to prepare the test data.

SUMMARY OF THE INVENTION

An object of the present invention is to provide a circuit having testing function capable of easy testing.

Another object of the present invention is to provide a circuit having testing function capable of effective testing.

A further object of the present invention is to provide a circuit having testing function capable of reducing time required for testing.

A still further object of the present invention is to provide a circuit having testing function in which preparation of test data is easy.

A still further object of the present invention is to provide a circuit having testing function requiring smaller number of external terminals for testing.

A still further object of the present invention is to provide a circuit having testing function which simplifies the control for testing.

In order to attain the above described objects, the circuit having testing function in accordance with the present invention comprises a plurality of circuit portions, a plurality of testing circuits and a plurality of control means. The plurality of circuit portions constitute a data processing circuit having an operation mode and a test mode. A plurality of testing circuits are provided corresponding to the plurality of circuit portions, make the plurality of circuit portions function as the data processing circuit in the operation mode, and independently test the corresponding circuit portions in the test mode. The plurality of control means provide control signals corresponding to the operation mode or the test mode to each of the plurality of testing circuits to activate the plurality of testing circuits.

In order to attain the above described object, the circuit having testing function in accordance with the present invention comprises, in a certain aspect, a plurality of circuit portions, a plurality of testing circuits and control means. The plurality of circuit portions constitute a data processing circuit having an operation mode and a test mode. The plurality of testing circuits are provided corresponding to the plurality of circuit portions, make the plurality of circuit portions function as the data processing circuit in the operation mode, and test the corresponding circuit portions in the test mode. The control means applies a first control signal corresponding to the operation mode to each of the plurality of testing circuits by a first input signal and applies a second control signal corresponding to the test mode to each of the plurality of testing circuits by a second input signal, so as to activate the plurality of testing circuits.

The circuit having testing functions structured as described above can receive test data in parallel at desired circuit portions and it can output the result of testing in parallel. Therefore, the preparation of the test data becomes easy and the time required for testing can be reduced.

In an aspect of the invention, the circuit having testing function structured as described above requires smaller number of signals controlling the testing circuit, whereby the number of external terminals required for control can be reduced to facilitate the control of testing.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 3:
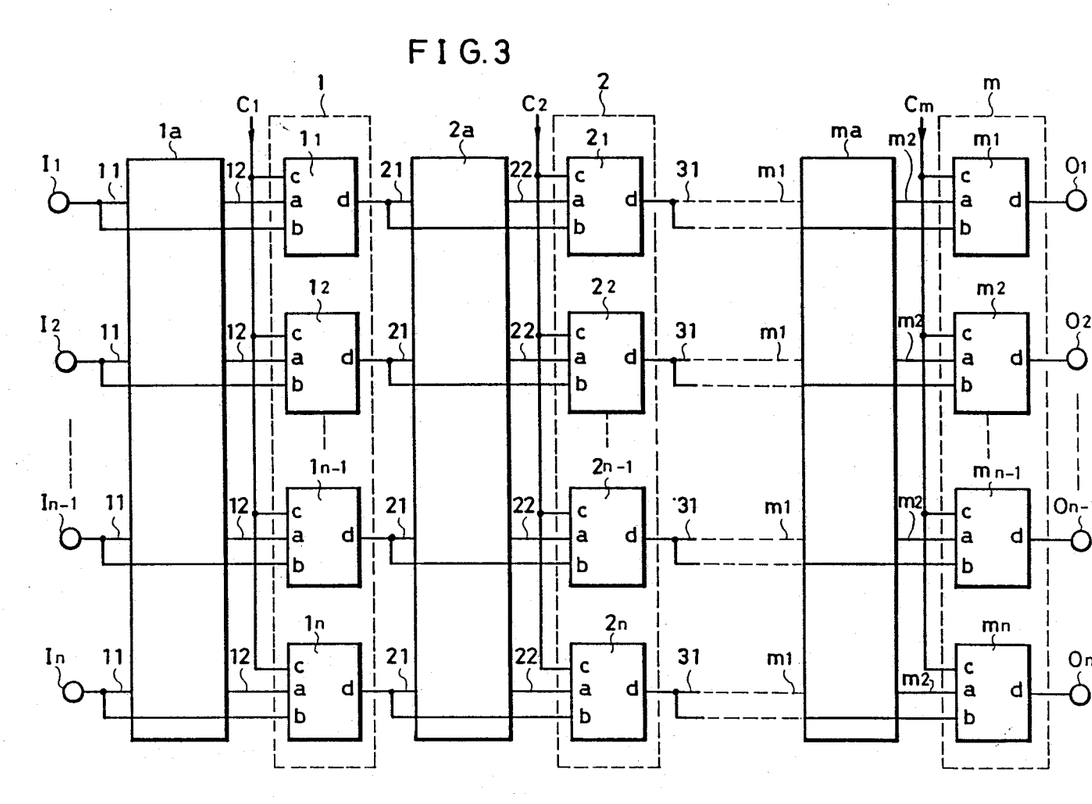
FIG. 3 is a schematic diagram showing a circuit having testing function in accordance with one embodiment of the present invention.

FIG. 3 is a schematic diagram showing a circuit having testing function in accordance with the present invention, in which parallel scan register type testing circuits are incorporated to test each of the circuit portions constituting a data processing circuit, on the output side of each of the circuit portions.

Referring to the figure, each of the circuit portions 1a, 2a ... ma is formed of, for example, a combinational logic circuit, comprising n input terminals 11, 21, ... ml and n output terminals 12, 22, ... m2.

The testing circuits are constituted by m parallel registers (unit test circuit) 1, 2, 3 ... m comprising n scan latch circuits $1_1 \sim 1_n$, $2_1 \sim 2_n$ ... $m_1 \sim m_2$, respectively. Each of the scan latch circuits $1_l \sim 1_n$, $2_l \sim 2_n$, ... $m_l \sim m_n$ comprises a first input terminal a, a second input terminal b, a control terminal c and an output terminal d. Either a signal inputted to the first input terminal a or a signal inputted to the second input terminal b is selectively outputted to the output terminal d in accordance with a control signal C ($C_1 \sim C_m$) inputted to the control terminal C.

The function of the scan latch circuits $1_l \sim 1_n$, $2_l \sim 2_n$, ... $m_l \sim m_n$ is attained by the structure shown in FIG. 2, as an example. Namely, when the control signal C is at the "L" level, it takes a signal inputted to the first input terminal a in synchronization with a clock signal $\phi$ to output the same directly, and when the control signal C is at the "H" level, it takes a signal inputted to the second input terminal b in synchronization of the clock signal $\phi$ to output the same directly.

The first parallel register 1 is arranged on the output side of the first circuit portion 1a, the second parallel register 2 is arranged on the output side of the second circuit portion 2a, and the same arrangement is repeated with the mth parallel register arranged on the output side of the mth circuit portion ma. In this manner, parallel registers $1 \sim m$ are arranged on the output side of the respective circuit portions $1a \sim ma$. A series connection of one circuit portion and one parallel register constitutes a set of circuit elements, and a series connection of the circuit portions $1a \sim ma$ constitutes the whole data processing circuit.

The n input terminals 11 of the first circuit portion 1a are respectively connected to the data input terminals $I_l \sim I_n$. The first input terminals a of the scan latch circuits $1_l \sim 1_n$ constituting the first parallel register 1 are respectively connected to the output terminals 12 of the first circuit portion 1a. The second input terminals b are respectively connected to the said data input terminals $I_l \sim I_n$. The output terminals d of the scan latch circuits $1_l \sim 1_n$ are respectively connected to the input terminals 21 of the second circuit portion 2a.

In the similar manner, first input terminals a of the scan latch circuits $2_l \sim 2_n$ constituting the second parallel register 2 are respectively connected to the output terminals 22 of the second circuit portion 2a. The second input terminals b are respectively connected to the output terminals d of the scan latch circuits $1_l \sim 1_n$ constituting the first parallel register 1. The output terminals d of the scan latch circuits $2_l \sim 2_n$ are respectively connected to the input terminals 31 of the third circuit portion 3a. The terminals of the scan latch circuits are connected in the above described manner. The first input terminals a of the scan latch circuits $m_l \sim m_n$ constituting the mth parallel register m are respectively connected to the output terminals m2 of the mth circuit portion ma. The second input terminals b are respectively connected to the output terminals d of the scan latch circuits $(m-1)_1 \sim (m-1)_n$ constituting the m−1th parallel register m-1 (not shown). The output terminals d of the scan latch circuits $m_l \sim m_n$ are respectively connected to the data output terminals $O_1 \sim O_n$.

The control terminals c of respective scan latch circuits $1_l \sim 1_n$ $2_l \sim 2_n$, ... $m_1 \sim m_n$ are connected together for each of the parallel registers 1, 2 ... m to receive control signals $C_1, C_2, \ldots C_m$, independently.

The operation of the testing circuit shown in FIG. 3 will be described in the following.

The operation of the testing circuit can be divided into the operation mode and the test mode.

In the operation mode, all control signals $C_1, C_2, \ldots C_m$ are all fixed at the "L" level. On this occasion, each of the scan latch circuits $1_l \sim 1_n$, $2_l \sim 2_n$, ... $m_1 \sim m_n$ takes the data inputted to the first input terminal a to output the same directly to the output terminal d. The data inputted to the data input terminals $Il_1 \sim I_n$ are successively processed in the circuit portions $1a \sim ma$ in response to the clock signals, (not shown), and thereafter they are simultaneously outputted from the data output terminals $O_l \sim O_n$ in parallel.

In the test mode, only some of the control signals $C_1, C_2, \ldots C_m$ are set at the "L" level.

Description will be given of a case in which the second circuit portion 2a is tested, for example.

Control signals $C_1, C_3 \sim C_m$ are set at the "H" level and the control signal $C_2$ is set at the "L" level. On this occasion, the scan latch circuits $1_1 \sim 1_n$ take the data inputted to the second input terminals b to output the same to the output terminals d. Therefore, the n bit test data inputted to the data input terminals $I_l \sim I_n$ are directly inputted to the second circuit portion 2a. The scan latch circuits $2_l \sim 2_n$ take the data inputted to the first input terminals a and output the same to the output terminals d, so that the data processed in the second circuit portion 2a are taken to the scan latch circuits $2_l \sim 2_n$ to be outputted to the output terminals d. In addition, scan latch circuits $3_l \sim 3_n$ take the data inputted to the second input terminals b to output the same to the output terminals d. Similarly, the scan latch circuits $4_l \sim 4_n, \ldots m_1 \sim m_n$ take the data inputted to the second input terminals b to output the same to the output terminals d. Therefore, the data outputted to the output terminals d of the scan latch circuits $2 \sim 2_n$ are directly outputted from the data output terminals $O_1 \sim O_n$.

In this manner, the n bit test data inputted to the data input terminals $I_l \sim I_n$ are taken into the second circuit portion 2a through the first parallel register 1. The test data are processed by the second circuit portion 2a and thereafter they are outputted from the data output terminals $O_l \sim O_n$ through the second parallel register 2 to the mth parallel register m. Therefore, in the test mode, the structure equivalently comprises a stage of a parallel register in the preceding stage of the second circuit portion 2a and m-1 stages of parallel registers arranged in series in the succeeding stage thereof. Namely, circuit portions other than the second circuit portion 2a do not function in this case. The circuit portion 2a and the parallel registers $1 \sim m$ process data in synchronization with the said clocks signal, so that n bit data inputted to the data input terminals $I_l \sim I_n$ are processed in the circuit portion 2a and thereafter, they are simultaneously outputted from the data output terminals $O_l \sim O_n$ in parallel.

In the electric circuit having testing function in accordance with this embodiment, the test data can be inputted only to a desired circuit portion in parallel and the data processed only in that circuit portion can be outputted in parallel. Therefore, the preparation of the test data becomes simple, and the test of each circuit portion can be carried out easily, whereby the time required for the testing can be reduced. By connecting a prescribed measuring circuit to the output terminals $O_l \sim O_n$, the output of desired circuit portion can be measured to test that circuit portion.

The electric circuit having testing function in accordance with this embodiment is structured as described above, and control signals $C_l \sim C_m$ must be applied to the m parallel registers when there are m circuit portions to be tested. Consequently, m external terminals must be provided to input externally the control signals $C \sim C_m$.

Accordingly, as the number of the circuit portions increases, the number of necessary external terminals must be increased. However, the increase of the number of necessary external terminals is difficult in some cases, for example, in a semiconductor integrated circuit in which there are strict limitations in structure. In addition, the increase of the control signals C makes it difficult to control the testing of each circuit portion.

Another example of the present invention capable of solving the above described problems will be described in the following.

Figure 4:
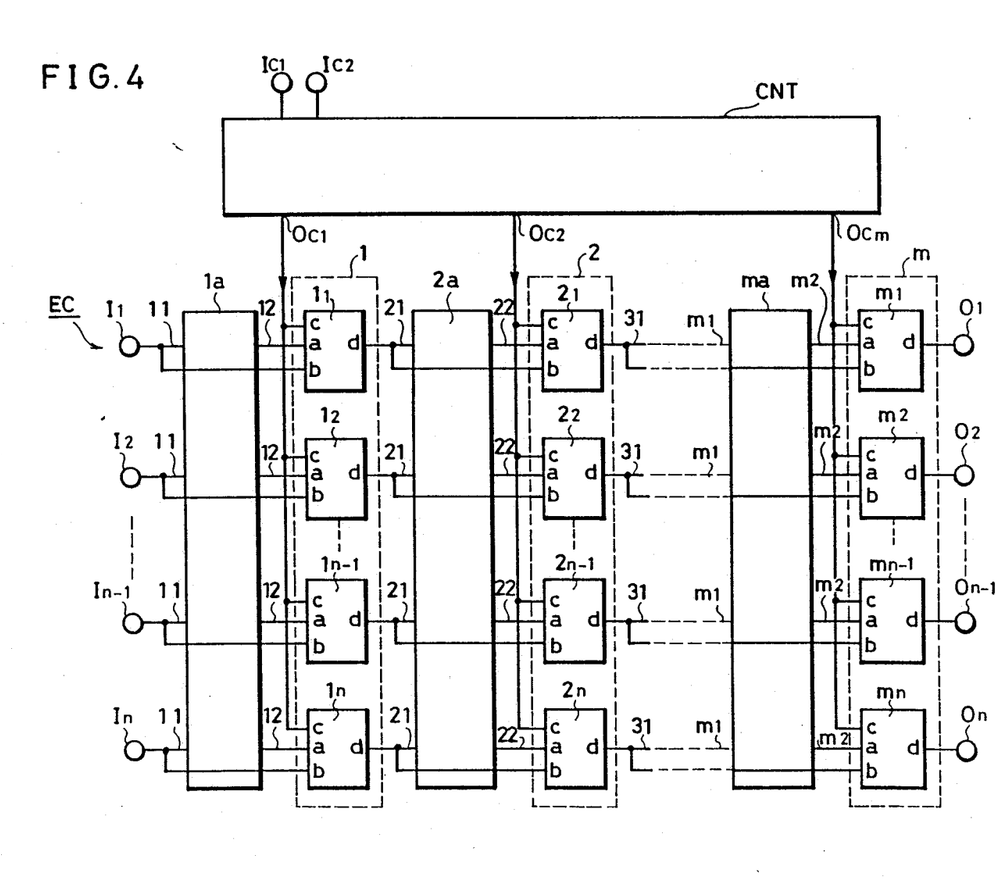
FIG. 4 is a schematic diagram showing a circuit having testing function in accordance with another embodiment of the present invention.

FIG. 4 is a schematic diagram showing an electric circuit having testing function in accordance with another embodiment of the present invention.

Referring to the figure, the electric circuit having testing function comprises m circuit portions 1a, 2a, ... ma constituting a data processing circuit EC, parallel registers 1, 2, ... m (unit test circuit) respectively provided on the output side of the circuit portions to independently test the circuit portions, and a control circuit CNT for controlling the parallel registers 1, 2, ... m. A combination of the corresponding one circuit portion and one parallel register out of the circuit portions 1a~ma and the parallel registers 1~m constitutes a set of circuit elements, and a series connection of the circuit elements constitute the data processing circuit EC.

The circuit portions 1a, 2a, ... ma, parallel registers 1, 2, ... m, data input terminals $I_l \sim I_n$ and the data output terminals $O_l \sim O_n$ are structured in the same manner as the electric circuit of the above embodiment shown in FIG. 3. Namely, n input terminals 11 of the circuit portion 1a are respectively connected to the data input terminals $I_l \sim I_n$ of the data processing circuit EC. Similarly, the input terminals 21 ... ml of the respective circuit portions 2a ... ma are respectively connected to the output terminals d of the scan latch circuits $1_l \sim 1_n$ ... $(m-1)_l \sim (m-1)_n$ constituting the parallel registers 1 ... (m-1) of the preceding stages. The first input terminals a of the scan latch circuits $l_l \sim l_n$, ... $m_l \sim m_n$ constituting the parallel registers 1 ... m are respectively connected to the output terminals 12 ... m2 of the circuit portions 1a-ma of the preceding stages. The second input terminals b are respectively connected to the input terminals 11 ... ml of the circuit portions 1a~ma of the preceding stages. The output terminals d of the scan latch circuits $m_l \sim m_n$ constituting the parallel register m are respectively connected to the data output terminals $O_l \sim O_n$.

The control circuit CNT comprises two external terminals $I_{c1}, I_{c2}$ and m output terminals $O_{cl} \sim O_{cm}$. Control signals $C_l \sim C_m$ are respectively applied to the parallel registers 1~m from the output terminals $O_{cl} \sim O_{cm}$.

Figure 5:
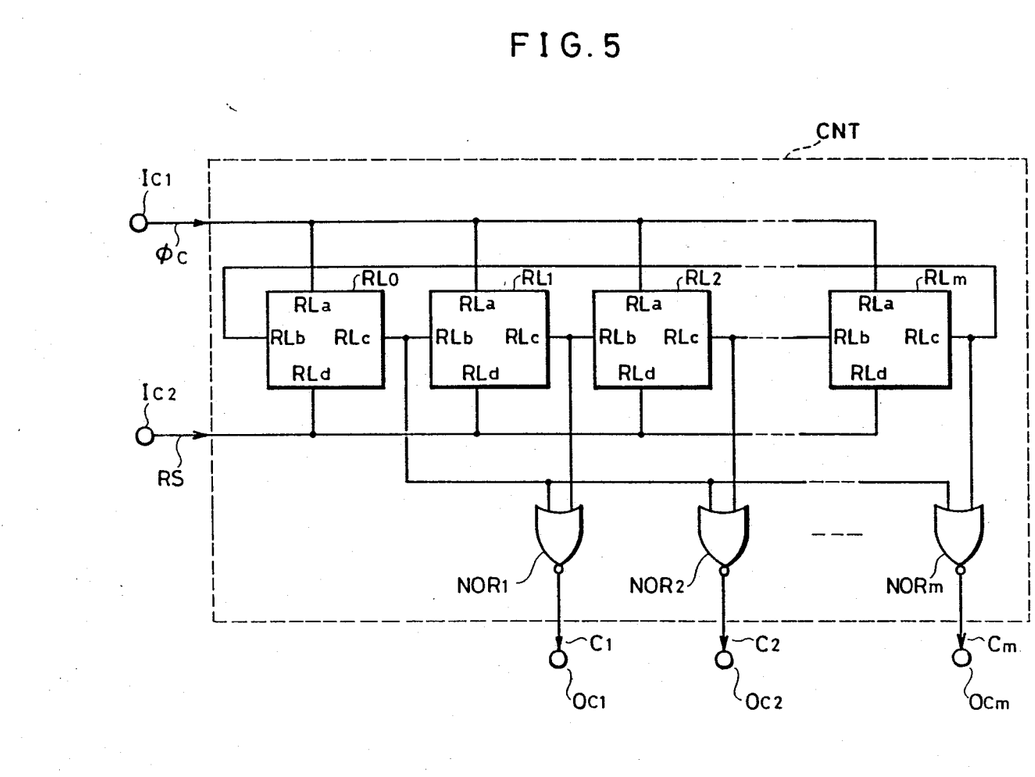
FIG. 5 is a schematic diagram showing a definite structure of the control circuit shown in FIG. 4.

FIG. 5 is a schematic diagram showing in detail the control circuit CNT of FIG. 4.

Referring to the figure, the control circuit CNT comprises (m+1) resettable latch circuits $RL_0 \sim RL_m$, m 2-input NOR circuits $NOR_1 \sim NOR_m$, a first external terminal $I_{c1}$, a second external terminal $I_{c2}$, and m output terminals $O_{cl} \sim O_{cm}$.

A data input terminal $RL_b$ of the resettable latch circuit $RL_0$ is connected to a data output terminal $RL_c$ of the resettable latch circuit $RL_m$. The data input terminal $RL_b$ of the resettable latch circuit $RL_1$ is connected to the data output terminal $RL_c$ of the resettable latch circuit $RL_0$. Similarly, the data input terminal $RL_b$ of the resettable latch circuit $RL_x$ is connected to the data output terminal $RL_c$ of the resettable latch circuit $RL_{x-1}$ (where x is an integer from 1~m). Each of the resettable latch circuits $RL_0 \sim RL_m$ comprises a clock terminal $RL_a$ and a reset terminal $RL_d$. Respective clock terminals $RL_a$ are connected to the first external terminal $I_{c1}$, and respective reset terminals $RL_d$ are connected to the second external terminal $I_{c2}$. The first input terminals of the NOR circuits $NOR_l \sim NOR_m$ are connected together to the data output terminal $RL_c$ of the resettable latch circuit $RL_0$. The second input terminals of the NOR circuits $NOR_l \sim NOR_m$ are respectively connected to the data output terminals $RL_c$ of the resettable latch circuits $RL_l \sim RL_m$. The output terminals of the NOR circuits $NOR_l \sim NOR_m$ are respectively connected to the output terminals $O_{cl} \sim O_{cm}$ of the control circuit CNT.

In each of the resettable latch circuits $RL_0 \sim RL_m$, the data is taken from the data input terminal $RL_b$ when a "H" level signal is inputted to the clock input terminal $RL_a$. When a "L" level signal is inputted to the clock input terminal $RL_a$, the taken data is held therein, and the held data is outputted from the data output terminal $RL_c$. When an "H" level signal is inputted to the reset terminal $RL_d$, the resettable latch circuit $RL_0$ holds the data "H". When "H" is inputted to the reset terminal $RL_d$, each of the resettable latch circuits $RL_l \sim RL_m$ holds the data "L".

The operation of the present embodiment shown in FIGS. 4 and 5 will be briefly described in the following.

The operation of the electric circuit having testing function of this embodiment can be divided into the operation mode MO and the test mode MT as in the electric circuit having testing function of the first embodiment. In the present embodiment, the switching of the mode is controlled by a control clock signal $\phi_c$ applied to the first external terminal $I_{c1}$ and a reset signal RS applied to the second output terminal $I_{c2}$ of the control circuit CNT.

The operation mode MO can be realized by inputting an "H" level reset signal RS to the second external terminal $I_{c2}$ of the control circuit CNT and maintaining the first external terminal $I_{c1}$ at the "L" level so as to fix the control signals $C_l \sim C_m$ from the output terminals $O_{cl} \sim O_{cm}$ all at the "L" level. On this occasion, the whole data processing circuit EC constituted by the circuit portions 1a, 2a ... ma successively processes data in synchronization with the clock signal $\phi$, not shown, as in the first embodiment.

The test mode MT can be realized by inputting a prescribed control clock signal $\phi_c$ and a reset signal RS respectively to the first and second external terminals $I_{c1}$ and $I_{c2}$ of the control circuit CNT so as to set only one of the control signals $C_l \sim C_m$ from the output terminals $O_{cl} \sim O_{cm}$ at "L" level and setting other control signals at the "H" level.

Let us assume a case in which the second circuit portion 2a is to be tested, for example. The control signals $C_1, C_3 \sim C_m$ outputted from the control circuit CNT are set at the "H" level and only the control signal $C_2$ should be set at the "L" level. On this occasion, the parallel register 1 takes the input data applied to the data input terminals $I_l \sim I_n$ and applies the input data directly to the circuit portion 2a as input. Meanwhile, the parallel register 2 takes the output data from the output terminal 22 of the circuit portion 2a, and the parallel registers 3~m take the output data from the output terminals d of respective parallel registers 2~(m-1) of the preceding stages to output the same directly. The output data of the parallel register m are outputted from the data output terminals $O_l \sim O_n$. Therefore, in this test mode, the structure equivalently comprises a stage of a parallel register in the preceding stage of the second circuit portion 2a and (m-1) stages of parallel registers arranged in series in the succeeding stages. Namely, the circuit portions other than the second circuit portion are bypassed, enabling the test only of the second circuit portion 2a.

Figure 6:
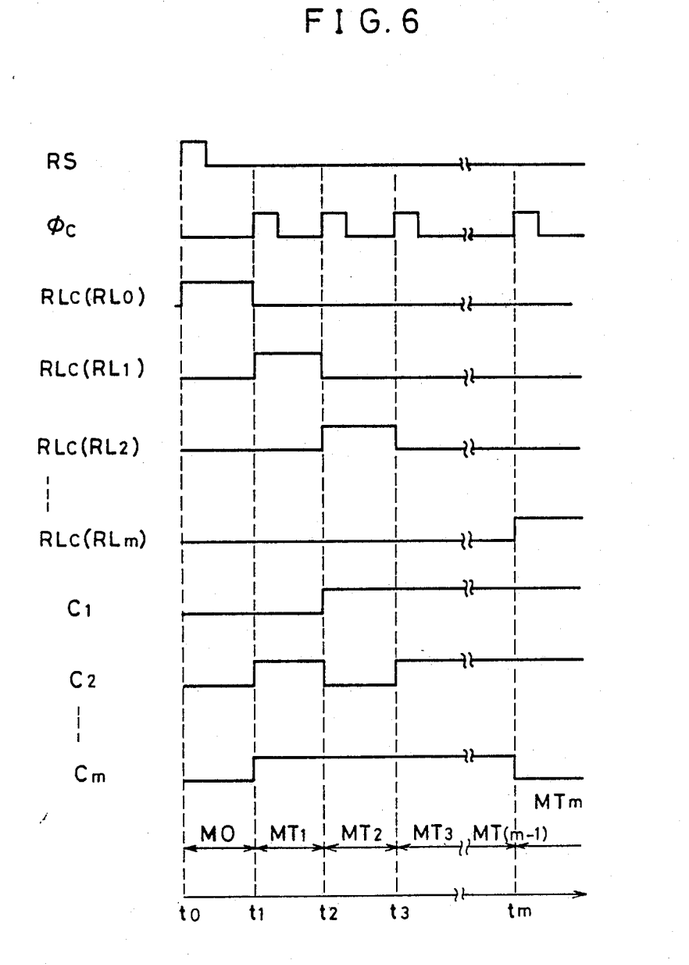
FIG. 6 is a timing chart for illustrating the operation of the control circuit shown in FIG. 5.

FIG. 6 is a timing chart showing the operation of the control circuit of FIG. 5.

In the following, the operation of the electric circuit having testing function in accordance with the present embodiment will be described in detail with reference to the timing chart. FIG. 6 shows a case in which the circuit is in the operation mode MO from the time $t_0$ to $t_1$ and in the test mode $MT_1 \sim MT_m$ after the time $t_2$.

First, the operation mode MO will be described. When an "H" level reset signal RS is inputted to the second external terminal $I_{c2}$ at the time $t_0$, an "H" level signal is outputted from the data output terminal $RL_c$ of the resettable latch circuit $RL_0$, and an "L" level signal is outputted from the data output terminals $RL_c$ of the resettable latch circuits $RL_c \sim RL_m$ respectively. On this occasion, an "H" level signal is supplied from the output terminal $RL_c$ of the resettable latch circuits $RL_0$ to respective first input terminals of the 2-input NOR circuits $NOR_l \sim NOR_m$. Consequently, the output signals from the NOR circuits $NOR_l \sim NOR_m$ all become "L" level, and therefore the control signals $C_l \sim C_m$ applied from the output terminals $O_{cl} \sim O_{cm}$ of the control circuit CNT to the parallel registers $1 \sim m$ all become "L" level. This corresponds to the above described operation MO, so that the data processing circuit EC carries out prescribed data processing in synchronization with the clock signal $\phi$, not shown. Namely, the resettable latch circuit $RL_0$ and the NOR circuits $NOR_l \sim NOR_m$ constitute level equalizing means which equalizes all of the control signals $C_l \sim C_m$ to "L" level when the signals applied to the first and second external terminals $I_{c1}$ and $I_{c2}$ are in the state as described above.

The test mode MT will be described in the following. First, the control circuit CNT is reset by the reset signal RS at the time to, and thereafter an "H" level control clock signal $\phi_c$ is inputted to the first external terminal $I_{c1}$ at the time $t_1$. The resettable latch circuit $RL_1$ takes the "H" level data held in the resettable latch circuit $RL_0$ from the input terminal $RL_b$, and the resettable latch circuit $RL_2$ takes the "L" level data held in the resettable latch circuit $RL_1$ from the input terminal $RL_b$. In the similar manner, respective resettable latch circuit $RL_x$ takes in the data of the resettable latch circuit $RL_{x-1}$ (x is an integer from $1 \sim m$) of the preceding stage, so that the "H" level data is held in the resettable latch circuit $RL_1$ and "L" level data are held in other resettable latch circuits $RL_0$, $RL_2 \sim RLm$. Consequently, the "L" level control signal $C_1$ is outputted from the NOR circuit $NOR_1$, and "H" level control signals $C_2 \sim C_m$ are outputted from the output terminals of the NOR circuits $NOR_2 \sim NOR_m$. This corresponds the test mode $MT_1$ testing the circuit portion 1a of FIG. 4.

Thereafter, at the time $t_2$, the "H" level control clock signal $\phi_c$ is again inputted to the first external terminal $I_{cl}$. Through the same operation as described above, the "H" level data is held in the resettable latch circuit $RL_2$ and the "L" level data are held in other resettable latch circuits $RL_0$, $RL_1$ and $RL_3 \sim RL_m$. Therefore, only the control signal $C_2$ becomes "L" level and other control signals $C_1$ and $C_3 \sim C_m$ become "H" level, which corresponds to the test mode $MT_2$ testing the circuit portion 2a.

Similarly, every time the "H" level input control clock $\phi c$ is inputted to the first external terminal $I_{cl}$, the circuit portion to be tested is successively selected from the test mode testing the circuit portion 3a, the test mode testing the circuit portion 4a ..., and the portions are periodically switched. Namely, the resettable latch circuits $RL_0 \sim RL_m$ constitute successive selecting means for successively selecting one of the control signals $C_l \sim C_m$ to bring the same to the "L" level when the reset signals RS and the control clock signal $\phi_c$ are applied at the timing which will be described later. The resettable latch circuit $RL_0$ is also a part of the successive selecting means in that it functions to start the selecting operation by transferring the "H" level to the resettable latch circuit $RL_1$.

As described above, only the first external terminal $I_{c1}$ and the second external terminal $I_{c2}$ require the control circuit CNT in this embodiment, at the test of the m circuit portions 1a-ma can be controlled by only two external terminals regardless of the number m of the circuit portions to be tested. Only by inputting the "H" level signal as a reset signal RS, the data processing circuit EC operates normally. In order to carry out testing, we have only to set the reset signal RS as the switching signal at the "H" level and to input the control clock signal $\phi_c$ so as to successively testing each of the circuit portions 1a-ma independently, whereby the testing can be effected quite easy.

Figure 7:
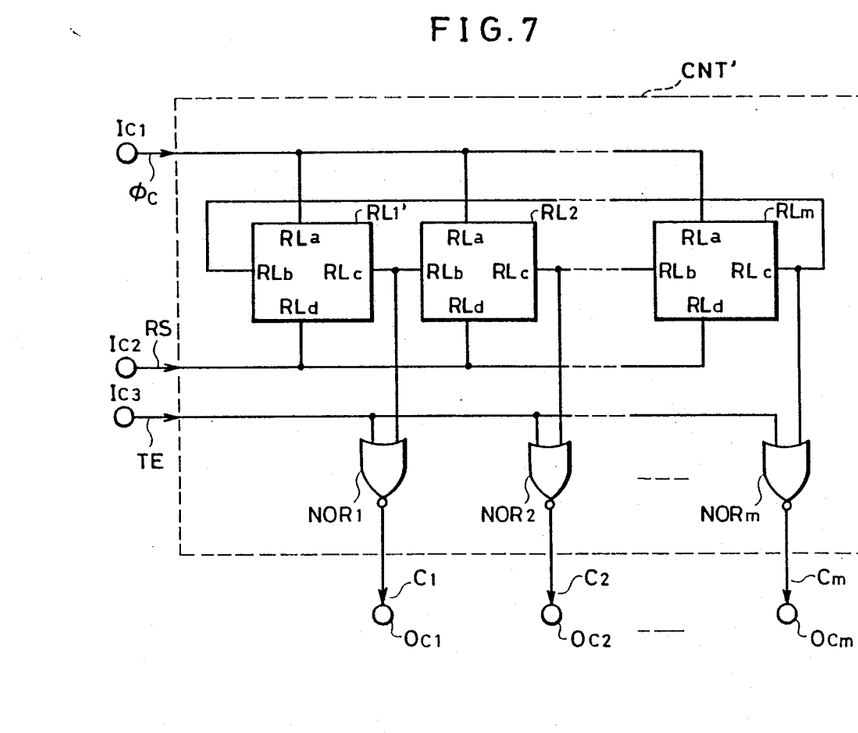
FIG. 7 is a schematic diagram of a control circuit of the circuit having testing function in accordance with a further embodiment of the present invention.

FIG. 7 is a schematic diagram of the control circuit shown in FIG. 4 in accordance with another embodiment.

In the embodiment of FIG. 5, the resettable latch circuit $RL_0$ is used as means for switching the operation mode MO and the test mode MT of the control circuit CNT. In this embodiment, a third external terminal $I_{c3}$ is provided to which a mode switching signal TE is inputted. The resettable latch circuit $RL_0$ for switching mode in the control circuit CNT of FIG. 5 is eliminated in the control circuit CNT' of FIG. 7. Alternately, the third external terminal $I_{c3}$ is provided, which is connected to the first input terminals of the 2-input NOR circuits $NOR_l \sim NOR_m$. The resettable latch circuit $RL_1'$ functions to hold the data "H" when an "H" level signal is inputted to the reset input terminal $RL_d$, as did the resettable latch circuit $RL_0$ of FIG. 5. Other structure of the control circuit CNT' is the same as that of the control circuit CNT shown in FIG. 5.

In order to set the data processing circuit EC at the operation mode MO by using the control circuit CNT', a "H" level mode switching signal TE should be inputted to the third external terminal $I_{c3}$. By doing so, the control signals $C_l \sim C_m$ all become "L" level signals regardless of the output from the resettable latch circuits $RL_1'$, $RL_2 \sim RL_m$, realizing the operation mode MO.

In order to set the test mode MT, the mode switching signal TE is set at the "L" level and the reset signal RS is set at the "H" level. Consequently, only the control signal Cl becomes "L" level and other control signals $C_2 \sim C_m$ become "H" level, realizing the test mode $MT_1$ testing the circuit portion 1a. Therefore, in this case, the mode switching signal TE and the reset signal RS serve as the switching signals from the operation mode to the test mode.

As in the above described control circuit CNT, the circuit portions $2a \sim ma$ are successively selected every time the control clock signal $\phi_c$ is inputted, realizing the test mode $MT_2 \sim MT_m$. Namely, in the embodiment of FIG. 7, the resettable latch circuits $RL_1'$, $RL_2 \sim RL_m$ constitute the successive selecting means, and the NOR circuits $NOR_1 \sim NOR_m$ constitute the level equalizing means.

As described above, according to the present invention, the number of necessary external control inputs is reduced by the provision of the level equalizing means and the successive selecting means, whereby a testing circuit can be provided which requires smaller number of external terminals for the control, and the testing can be easily carried out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit having testing function, comprising:
   a plurality of circuit portions constituting a data processing circuit having an operation mode and a test mode.
   a plurality of testing means provided corresponding to said plurality of circuit portions, for making said plurality of circuit portions function as said data processing circuit in said operation mode and testing corresponding circuit portions independently in said test mode by concurrently bypassing at least another said circuit portion in said test mode; and
   control means applying control signals corresponding to said operation mode or said test mode to each of said plurality of testing circuits to activate said plurality of testing circuits.

2. A circuit having testing function according to claim 1, wherein
   each of said plurality of circuit portions comprises input terminals $(1_1 \sim m_1)$ and output terminals $(1_2 \sim m_2)$; and
   each of said plurality of testing circuits comprises scan latch circuit $(1_1 \sim m_n)$, said scan latch circuit having a first input terminal (a), a second input terminal (b), a control terminal (c) and a scan output terminal (d), with said first input terminal connected to an output terminal of the corresponding circuit portion, said second input terminal connected to an input terminal of the corresponding circuit portion, said control terminal receiving control signals $(c_l \sim c_m)$ from said control means, and said scan output terminal connected to an input terminal of another circuit portion.

3. A circuit having testing function according to claim 2, wherein
   each of said plurality of circuit portions comprises a plurality of sets of input terminals and output terminals, and each of said plurality of testing circuits comprises said scan latch circuit, the number of which corresponds to the number of the input terminals and the output terminals of the corresponding circuit portion.

4. A circuit having testing function according to claim 3, wherein the control terminals of said plurality of scan latch circuits of said testing circuit are connected to each other to receive said control signals.

5. A circuit having testing function according to claim 4, further comprising a plurality of data input terminals to which data to be processed or data for testing are inputted, and a data output terminal outputting processed data or tested data,
   said data input terminal connected to an input terminal of one of said circuit portions and to a second input terminal of the scan latch circuit included in the testing circuit corresponding to said one circuit portion,
   said output terminal connected to the scan output terminal of the scan latch circuit included in the testing circuit corresponding to another one of said circuit portions.

6. A circuit having testing function according to claim 2, wherein
   said control signal comprises a first signal defining the operation mode and a second signal defining the test mode,
   said first input terminal and said scan output terminal are conducted by the application of said first signal to said control terminal, and
   said second input terminal and said scan output terminal are conducted by the application of said second signal to said control terminal.

7. A circuit having testing function, comprising:
   a plurality of circuit portions $(1a \sim ma)$ constituting a data processing circuit having an operation mode and test mode;
   a plurality of testing means $(1 \sim m)$ provided corresponding to said plurality of circuit portions, for making said plurality of circuit portions function as said data processing circuit in said operation mode and testing corresponding circuit portions independently in said test mode by bypassing at least one said circuit portion in said test mode; and
   control means (CNT) applying a first control signal corresponding to said operation mode to each of said plurality of testing circuits in accordance with a first input signal, and applying a second control signal corresponding to said test mode to each of said plurality of testing circuits in accordance with a second input signal, thereby activating said plurality of testing circuits.

8. A circuit having testing function according to claim 7, wherein
   said control means comprises two input terminals to which said first or second input signal is inputted, and output terminals, the number of which corresponds to the number of said testing circuits, from which said first or second control signal is outputted.

9. A circuit having testing function according to claim 8, wherein
   said control means comprises:
   level equalizing means $(RL_0, NOR_1 \sim NOR_m)$ bringing all of said first control signals applied to said plurality of testing circuits to the same level in response to said first input signal; and
   selecting means $(RL_0, NOR_1 \sim NOR_m)$ successively selecting one control signal out of said control signals applied to said plurality of testing circuits to bring only the selected control signal to a prescribed level, in response to said second input signal.

10. A circuit having testing function according to claim 9, wherein said level equalizing means comprises one resettable latch circuit and a plurality of NOR circuits whose number being the same as that of said testing circuits.

11. A circuit having testing function according to claim 9, wherein
    said selecting means comprises a plurality of resettable latch circuit whose number being the same as that of said testing circuits.

12. A circuit having testing function according to claim 7, wherein
said control means comprises three input terminals to which said first or second input signal is inputted; and output terminals, whose number corresponding to that of said testing circuits, from which said first or second control signal is outputted.

13. A circuit having testing function according to claim 12, wherein
said control means comprises:
level equalizing means ($NOR_1 \sim NOR_m$) bringing said first control signals applied to said plurality of said testing circuits to the same level in response to said first input signal; and
selecting means ($RL_l, \sim RL_m$) successively selecting one control signal out of said second control signals applied to said plurality of testing circuits to bring only the selected control signal to a prescribed level, in response to said second input signal.

14. A circuit having testing function according to claim 13, wherein said level equalizing means comprises NOR circuits whose number being the same as that of said testing circuits.

15. A circuit having testing function according to claim 13, wherein
said selecting means comprises resettable latch circuits whose number being the same as that of said testing circuits.

16. A circuit having testing function according to claim 7, wherein
each of said plurality of circuit portions comprises an input terminal and an output terminal, and
each of said plurality of testing circuits comprises a scan latch circuit, said scan latch circuit having a first input terminal, a second input terminal, a control terminal and a scan output terminal, said first input terminal connected to an output terminal of the corresponding circuit portion, said second input terminal connected to an input terminal of the corresponding circuit portion, said control terminal receiving a first or second control signal from said control means, said scan output terminal connected to an input terminal of another circuit portion.

17. A circuit having testing function according to claim 16,
each of said plurality of circuit portions comprises a plurality of sets of input terminals and output terminals, and each of said plurality of testing circuits comprises said scan latch circuits whose number corresponding to the number of the input terminals and the output terminals of the corresponding circuit portion.

18. A circuit having testing function according to claim 17, wherein
control terminals of the plurality of scan latch circuits in said testing circuit are connected to each other to receive said first or second control signal.

19. A circuit having testing function according to claim 18, further comprising a plurality of data input terminals to which data to be processed or data for testing are inputted, and a data output terminal outputting processed data or tested data,
a respective one of said data input terminals connected to an input terminal of one of said circuit portions and to said second input terminal of the scan latch circuit included in the testing circuit corresponding to said one circuit portion,
said output terminal connected to the scan output terminal of the scan latch circuit included in the testing circuit corresponding to another one of said circuit portions.

20. A plurality of testing circuits provided corresponding to a plurality of circuit portions constituting a data processing circuit having an operation mode and test mode, for independently testing corresponding circuit portions, each comprising:
connecting means ($l \sim m$) for connecting the corresponding circuit portion to another circuit portion, said connecting means making the connected circuit portions functions function as a portion of said data processing circuit in said operation mode and testing the corresponding circuit portion in said test mode by bypassing at least one said circuit portion in said test mode; and
control means ($c_1 \sim c_m$) applying plural control signals respectively corresponding to said operation mode and said test mode to said connecting means to activate said connecting means.

21. Testings circuit according to claim 20, wherein
each of said circuit portions comprises an input terminal and an output terminal, and
said connecting means comprises a scan latch circuit, said scan latch circuit having a first input terminal, a second input terminal, a control terminal and a scan output terminal, said first input terminal connected to an output terminal of the corresponding circuit portion, said second input terminal connected to an input terminal of the corresponding circuit portion, said control terminal receiving a control signal from said control means, and said scan output terminal connected to an input terminal of another circuit portion.

22. Testing circuits according to claim 21, wherein
each of said circuit portions comprises a plurality of sets of input terminals and output terminals, and said connecting means comprises said scan latch circuits whose number corresponding to the number of the sets of input terminals and the output terminals of the corresponding circuit portion.

23. Testing circuits according to claim 22, wherein
control terminals of the plurality of scan latch circuits in said connecting means are connected to each other to receive said control signal.

* * * * *